United States Patent [19]

Hennig

[11] Patent Number: 5,763,928
[45] Date of Patent: Jun. 9, 1998

[54] HALL EFFECT MODULATION OF RESISTOR VALUES

[76] Inventor: Falke Hennig, 10149 Adriana Ave., Cupertino, Calif. 95014

[21] Appl. No.: 589,149

[22] Filed: Jan. 22, 1996

Related U.S. Application Data

[63] Continuation of Ser. No. 252,479, Jun. 1, 1994, Pat. No. 5,488,250.

[51] Int. Cl.$^6$ .......................... H01L 29/82; H01L 43/04; H01L 43/10; H01L 43/06
[52] U.S. Cl. .......................... 257/421; 257/424; 257/427; 338/32 H; 365/158; 365/170
[58] Field of Search .......................... 257/421, 422, 257/424, 425, 427; 338/32 H; 365/158, 170

[56] References Cited

U.S. PATENT DOCUMENTS

| | | | |
|---|---|---|---|
| 3,617,975 | 11/1971 | Wieder | 257/425 |
| 5,295,097 | 3/1994 | Lienau | 365/170 |
| 5,329,480 | 7/1994 | Wu et al. | 365/170 |

OTHER PUBLICATIONS

IBM TDB vol. 31 No. 7 Dec. 1988 "Magnetic Current Switch" pp. 395–396.

*Primary Examiner*—Jerome Jackson
*Attorney, Agent, or Firm*—Townsend and Townsend and Crew LLP

[57] ABSTRACT

A semiconductor structure is disclosed in which two regions of semiconductor material positioned adjacent to each other have different electron mobilities. By application of a magnetic field to the device, a Hall voltage is created across the boundary region between the regions of semiconductor material to modify their resistance. By detecting the change in resistance, the device can function as a memory cell, a programmable logic device, a head for hard disk drives, a measurement tool for measuring magnetic fields, or other apparatus.

24 Claims, 11 Drawing Sheets

HALL EFFECT MODULATION OF RESISTOR VALUES

This application is a continuation of Ser. No. 08/252,479 filed Jun. 1, 1994 now U.S. Pat. No. 5,488,250.

BACKGROUND OF THE INVENTION

This invention relates to the use of the Hall Effect in electronic devices to change the resistance of electronic components for a variety of applications, for example, to store information, to program logic devices, to sense or measure magnetic fields and derived quantities, as well as other applications.

Figure 1:
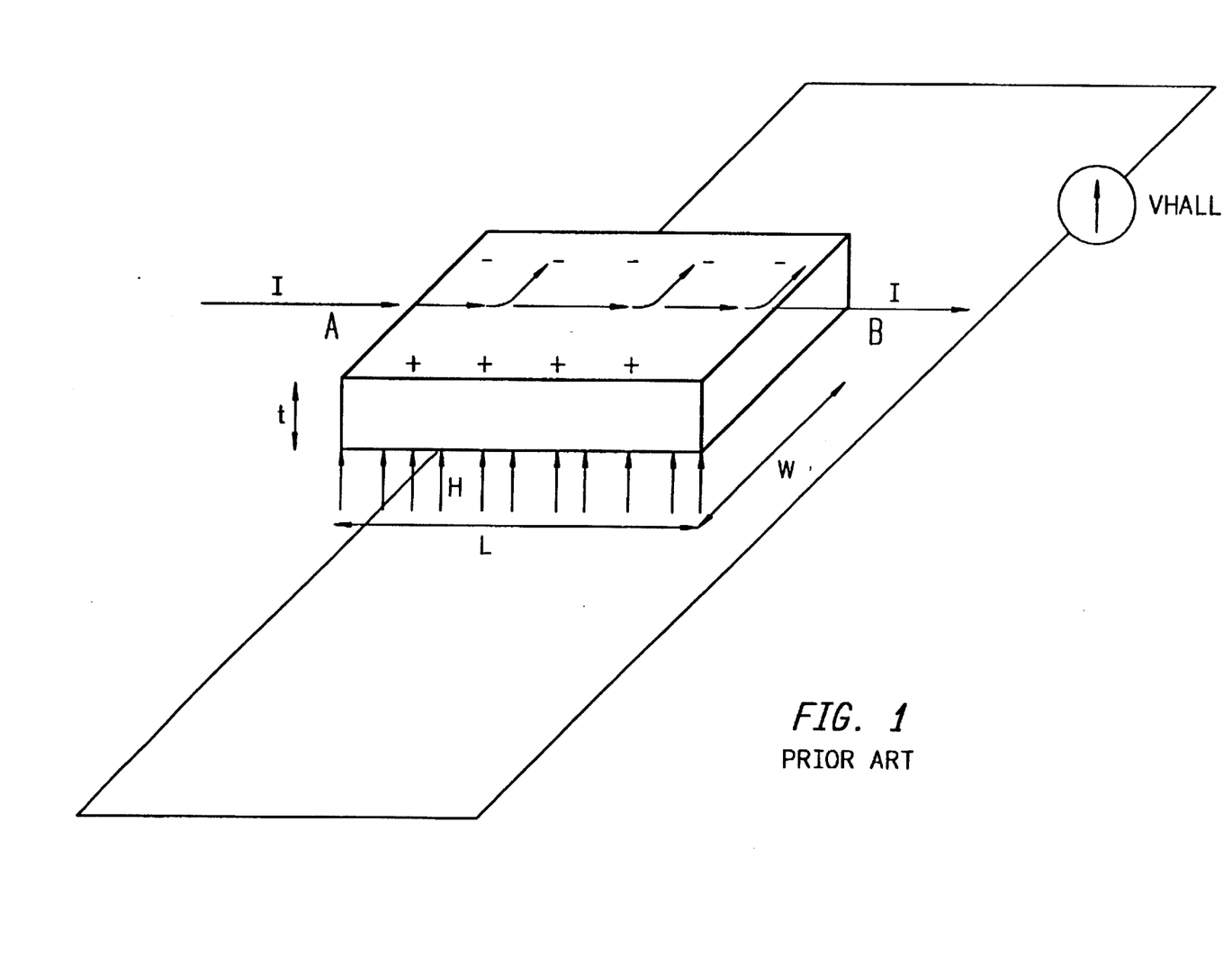
FIG. 1 conceptually illustrates the Hall effect.

The Hall Effect is a well known physical effect sometimes used in scientific equipment and for magnetic field measurements. The Hall Effect is the creation of an electric voltage inside an electrical conductor when it is conducting an electric current in the presence of a magnetic field. This magnetic field pushes the electronic carriers to one side of the conductor, giving rise to the Hall voltage. The Hall voltage is proportional to the applied magnetic field and to the electric current. It can be measured and used to determine other parameters. The Hall voltage is on the order of millivolts or microvolts for practical values of electric current and magnetic field. In most practical applications, however, the Hall Effect is insignificant. To a first order approximation the electrical resistance of a conductor between two points in a conductor, for example, points A and B in FIG. 1, is unaffected by the magnetic field and by the induced Hall voltage. The reason for this Hall independent behavior is that the total electrical conductance depends on the total sum of the carriers, not on their distribution in the conductor. A further description of the Hall Effect is found in Putley, *The Hall Effect and Semiconductor Physics*, Dover Publications, Inc., New York, 1968.

The two most prevalent types of semiconductor memory—dynamic random access memory (DRAM) and static random access memory (SRAM)—suffer from an inherent drawback. Each loses its stored information when electric power is disconnected. Read only memories (ROM) do not lose the stored information with the loss of electric power; however, information can be stored only once. ROM's are not practical in any application where their content is to be modified. This includes virtually all the memory requirement of electronic computing equipment. Other types of semiconductor devices—fusible-link devices and ultraviolet erasable programmable read only memories (UVPROM) push the time of programming beyond the device fabrication process. Programming occurs after the integrated circuits have been manufactured and packaged.

Recently, a type of memory known as electronically erasable read only memory (EEPROM) has become practical. EEPROM does not lose information when power is disconnected. Practical EEPROMs, however, suffer from a number of shortcomings. They are slow to program, and the data survive only a limited number of read/write cycles. Typically, large blocks of data are erased at one time (known as "flash memory"). These devices cannot be used for computer main memory—or for any application which requires fast, frequent loading and storing of data. No devices exist at present, which are both nonvolatile and practical as main memory for computers, both for storage of data and code.

Large, reliable, and inexpensive (but relatively slow) nonvolatile memory is available in the form of magnetic disks. In a typical hard disk drive a flat disk is coated with a magnetic thin film. Portions of the magnetic thin film are oriented in specific directions. The orientation of these magnetic domains identifies the stored information as either a "one" or a "zero" bit. To read or write data the magnetic disk rotates at high speed (typically 3600 rpm or higher), and a "magnetic head" is located in close proximity to the surface. During reading the head senses the contents of the magnetic domains as they move underneath it. It is also used to write areas of the disk during data storage.

For writing a bit, current is applied to a wired loop on the head, and to a structure which causes its magnetic field to penetrate into the magnetic thin film on the surface of the disk and magnetizes the area under the header appropriately to write a one or zero. To read the stored content of the thin film, its magnetic field is sensed by the head and translated into a voltage pulse whose polarity corresponds to the orientation of the underlying magnetic domain. The sensing is typically achieved by a conducting loop on the head, a magnetoresistive element, or a traditional Hall voltage sensor. The generated signal is quite small (millivolt range), and susceptible to noise. Complex circuitry is required to amplify and filter the sensed signal for further use. Also, magnetic disks are fragile mechanical devices, sensitive to failure under mechanical shock. This obstructs their use in many portable applications.

The achievable information storage density of hard disk drives depends significantly on the sensitivity of the magnetic field detection by the head. More sensitive detection directly translates into a higher hard disk storage density.

While magnetic disk technology is well established, access to the stored information is too slow to be useful as computer main memory. This is primarily because of the mechanical limitations of the disk rotation and moving the head to the addressed disk area. Also, accesses to the stored information are fundamentally sequential, and not random access.

Programmable logic devices allow changing the logic functionality of the device itself by modifying connections and/or current paths inside the device itself. Virtually all technologies useful for storing information in electronic devices by changing resistances or by opening/closing electronic switches or transistor paths can be used to alter logic inside the programmable logic devices. This includes ROM technology, UV ROM technology and EEROM technology, with all the previously described shortcomings of speed, field programmability, and the number of programming cycles, respectively.

SUMMARY OF THE INVENTION

In this invention the Hall effect is utilized to modulate the resistance of a conductive medium, and, if desirable, to keep this modulated resistance at a stable value. The value of the resistance forms the basis for measuring magnetic fields, for defining and storing information in memory cells, for sensitive read/write heads for magnetic hard disks, and for other uses. The difference between the methodology of this invention and the traditional Hall effect methodology is described below.

In accordance with this invention, a unitary slab of material is replaced by two or more parallel slabs of differing electron-hole mobilities, or by a slab of material with gradually increasing mobility. According to the Hall Effect, the magnetic field pushes the electrons from one of the media (referred to as medium 1) into the other media (referred to as medium 2) or vice versa, depending on the direction of the magnetic field. If medium 2 has a substantially different mobility from medium 1, and if a large percentage of the carriers cross the boundary between the two media, the electrical resistance between points A and B will be modified significantly, potentially by orders of magnitudes. The magnetic field can be applied externally or it can be a part of the structure itself. The magnetic field can be generated by a magnetic thin film whose magnetic polarity can be changed, and with it the value of the resistance. Such a structure is useful as both an analog device and a digital switch. Magnetic thin film technology and silicon integrated circuit technology are suitable to translate this phenomenon into practical useful devices.

DESCRIPTION OF THE SPECIFIC EMBODIMENTS

FIG. 1 is a diagram illustrating how the Hall effect creates the Hall voltage. As shown in FIG. 1, a slab of material has a current I flowing through it from point A to point B. A magnetic field H is applied in a direction perpendicular to the current flow across the width W and length L of the slab. The current I flowing in the presence of the magnetic field H creates a Hall voltage across the slab, also perpendicular to the current with the electrons being attracted to one side and repelled from the other side. This creates the Hall voltage across the slab.

Figure 2A:
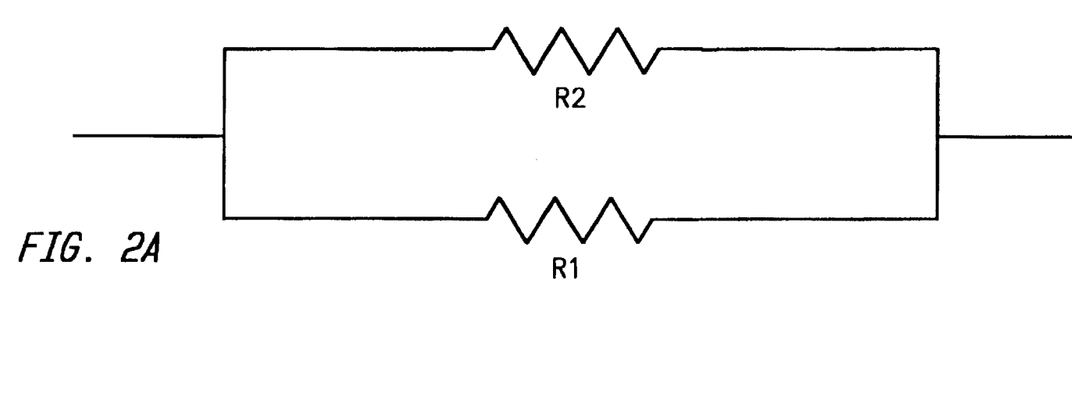
FIG. 2 illustrates the variation of electric resistance in an electric conductor consisting of two materials of different mobilities under the influence of a magnetic field.
Figure 2B:
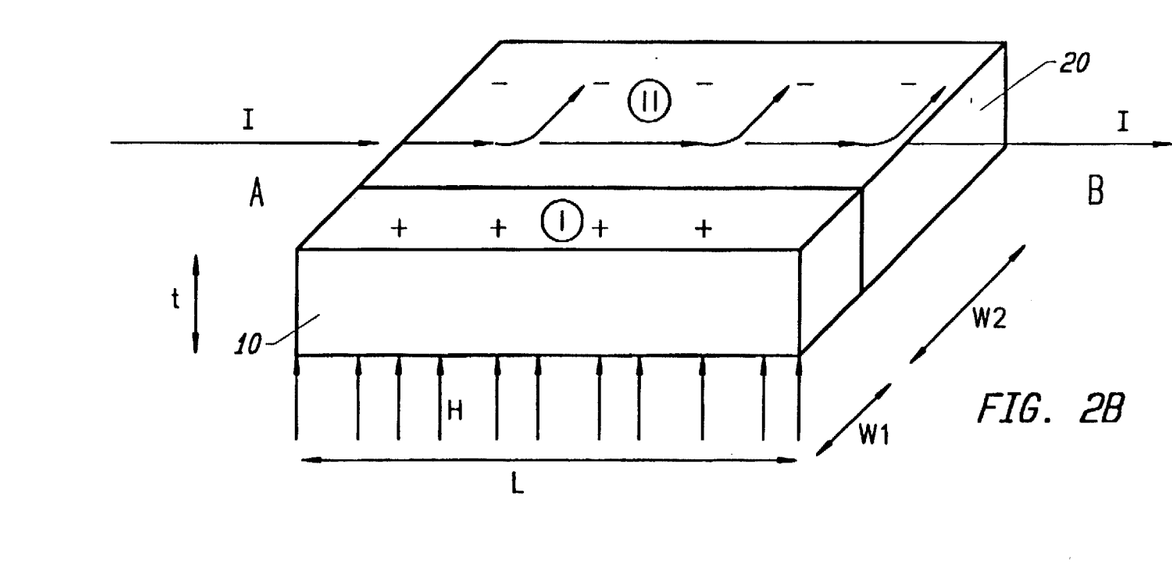

FIG. 2 illustrates a technique by which the Hall voltage is utilized according to this invention. As shown in FIG. 2, two different materials 10 and 20 are provided having different electron mobilities. Alternatively, a single material can be provided which has a gradient of mobility across its width. Assuming that material 20 has a substantially different mobility from material 10, and assuming that a large percentage of the carriers cross the boundary between the two materials, the electrical resistance between points A and B in FIG. 2 will be modified significantly, often by orders of magnitude, depending upon the particular conditions. The magnetic field H which is applied to the structure to cause this result can be applied from an external source, or can be part of the structure itself. The result is that both resistance R2 corresponding to the resistance of material 20 and resistance R1, which corresponds to the resistance of material 10 are modified significantly.

The structure shown in FIG. 2 is manufactured using conventional existing silicon integrated circuit technology. For example, material 20 can be polycrystalline or amorphous silicon, while material 10 is single crystalline silicon. Polycrystalline silicon and single crystalline silicon have considerably different mobilities.

In addition, unless the polycrystalline silicon 20 is very heavily doped, it will trap and immobilize most of the differential carriers which are pushed into it by the magnetic field, causing a very high resistance and therefore leading to a large resistance modulation. If the magnetic field depletes the crystalline silicon 10 completely of carriers, the theoretical resistance ratio between the two materials can be almost infinite. On the other hand, if the polarity of the magnetic field is reversed, the carriers are pushed into the high mobility, single crystalline silicon creating a very low resistance value. The high and low resistance values, which depend upon the direction of the magnetic field, create a "switch." When the crystalline silicon is depleted, it has a high resistance and appears to be an open switch to external circuitry. When the carriers are pushed into the single crystal silicon, it has a low resistance and appears as a closed switch to an external circuit.

When the structure shown in FIG. 2 is covered by a magnetic thin film and the polarity of the localized magnetic domains is controlled, the structure provides a basis for memory cells and programmable logic which can be implemented with existing integrated circuit technology. This is described further below.

Figure 3:
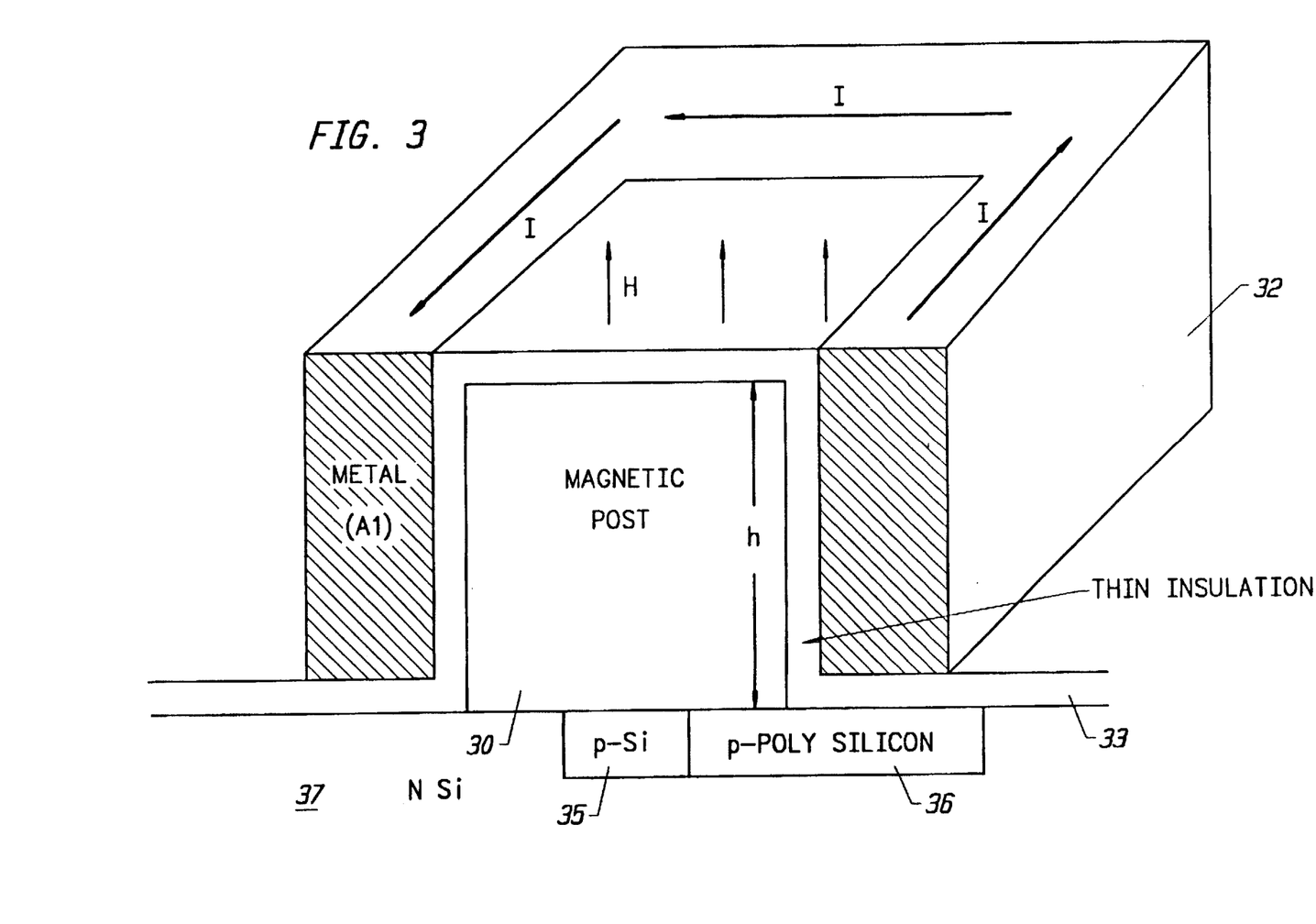
FIG. 3 illustrates a memory cell structure relying on the Hall effect.

FIG. 3 is a diagram illustrating a memory cell implemented according to this invention. The structure shown in FIG. 3 includes a magnetic post 30 surrounded by an annular metal region 32. Metal 32 is separated from post 30 by a thin layer of insulation 33. The entire structure is formed on the surface of the silicon substrate 37 in which a stripe of oppositely doped single crystalline silicon 35 is provided adjacent a stripe of also oppositely doped polycrystalline silicon 36. Preferably, the magnetic post is formed from cobalt or chromium oxides or alloys, while the annular metal region comprises aluminum.

To write data into this memory cell, the aluminum loop magnetizes the magnetic post in one of the two vertical directions (up or down), representing either a logic 0 or a logic 1, depending upon the convention preferred. That magnetic field results in the silicon-polycrystalline silicon stripes having either a high or low resistance, depending upon the direction of the magnetic field in magnetic post 30. To read the data, the resistance of the silicon stripe can be monitored. Depending upon the direction of the magnetization of the magnetic post, the silicon will be either depleted of mobile carriers and be in a high resistance state, or it will be enriched with mobile carriers and be in a low resistance state. Preferably, the post can be formed from magnetic thin film and etched using conventional technology. Below, I describe a technique for fabricating the structure shown in FIG. 3.

The behavior of the memory cell may be optimized by controlling the magnetic properties of the post, the doping of the silicon layer and its dimensions. As described below, preferably the silicon conductor will have a width of about 1000 to 3000 Angstroms, and the PN junction between the silicon stripe and the surrounding semiconductor material will provide a defining boundary for the conducting stripe. One technique for fabricating these stripes is to use well-known spacer etching techniques.

Figure 4A:
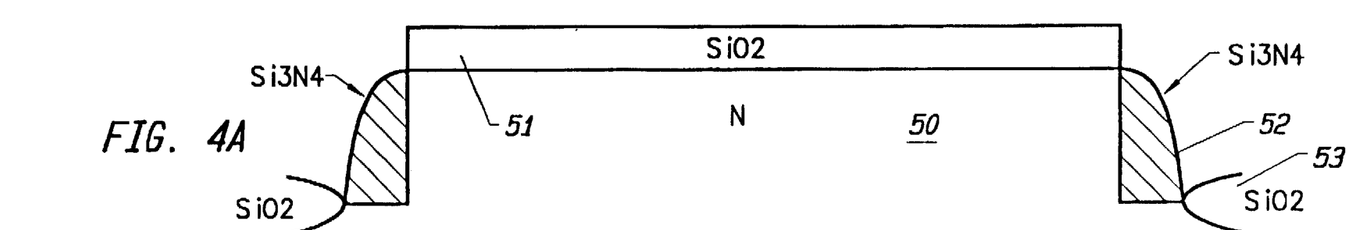
FIGS. 4a–4c illustrate a process for fabricating a thin stripe of crystalline silicon surrounded by polycrystalline silicon.
Figure 4B:
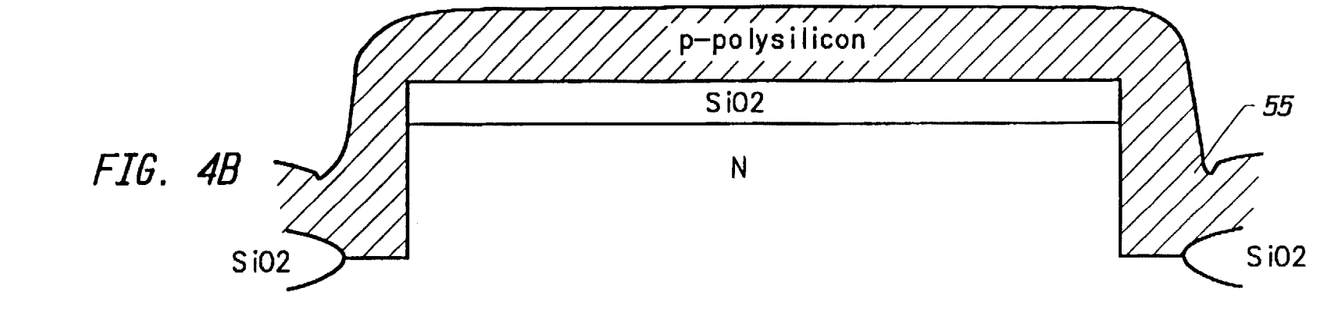
Figure 4C:
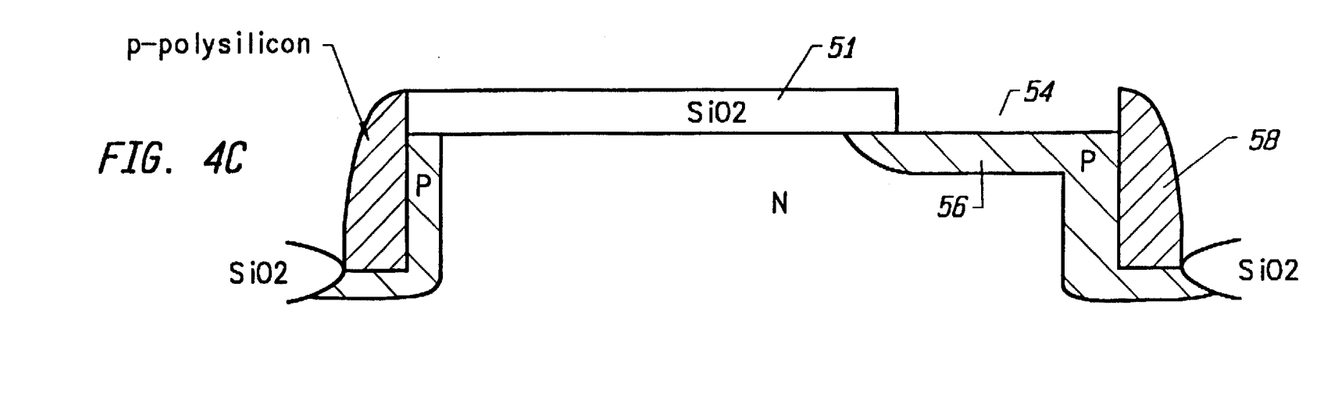

FIG. 4 illustrates a technique for forming the narrow layers using doped polycrystalline silicon as a diffusion source.

FIG. 4a illustrates the first step of this process for forming the silicon/polycrystalline silicon stripes. As shown in FIG. 4a, a silicon wafer is oxidized, then masked and etched to define a region of N type silicon 50. On the upper surface of the silicon dioxide 51, silicon nitride 52 is deposited. Using standard silicon process spacer etching techniques, silicon nitride spacer regions are formed at the edges of the N type silicon island 50. The entire structure is then further oxidized to create silicon dioxide regions 53 surrounding the silicon island. Note that the dimension between the silicon dioxide insulation surrounding the silicon nitride and the N type silicon 50 is defined by the thickness of the spacer region. Next, the silicon nitride is etched away and P type polycrystalline silicon 55 is deposited over the surface of the structure. The appearance of the structure at this stage of the process is shown in FIG. 4b.

Next, the polycrystalline silicon is removed from the upper surfaces of the island and the surrounding silicon dioxide, again using a spacer type etching process or a standard planovization process. A contact opening 54 is made through the silicon dioxide region 51. Boron, or other P type conductivity impurity 56 is then introduced into the silicon through the contact hole using ion implantation technology, for example. Next, the structure is heated to transfer P type impurity dopant from the polycrystalline silicon 58 into the silicon island 50. The resulting structure, with the silicon stripe formed adjacent the polycrystalline silicon stripe is shown in FIG. 4c.

Figure 5A:
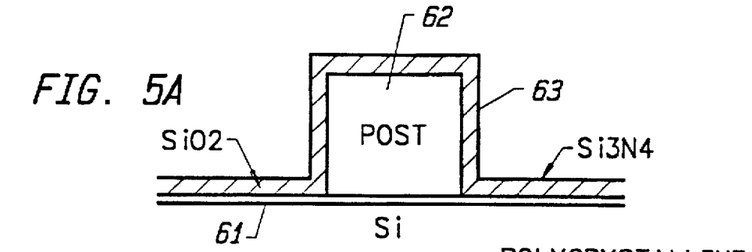
FIGS. 5a–5d and 6a–6c illustrate different techniques for constructing a magnetic post for the memory cell.

FIGS. 5a through 5d illustrate one technique for forming the magnetic post on the upper surface of the structure shown in FIG. 4. As shown in FIG. 5a, a layer of silicon dioxide 61 is formed across the upper surface of the structure, and a thicker layer of magnetic material 62, typically cobalt or chromium oxides or alloys, is deposited across the silicon, for example, using low pressure chemical vapor deposition technology. The magnetic layer is then masked and etched using conventional technology to form the desired size magnetic post. Next, a thin layer of silicon nitride 63 is deposited across the entire structure.

Figure 5B:
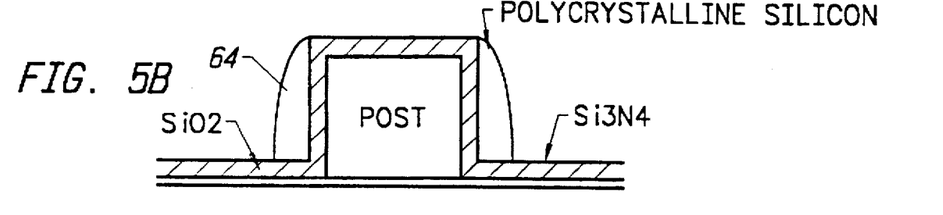

Next, as shown in FIG. 5b, a layer of polycrystalline silicon 64 is deposited, for example, using chemical vapor deposition, across the surface of the structure, and then etched to form polycrystalline silicon spacers.

Figure 5C:
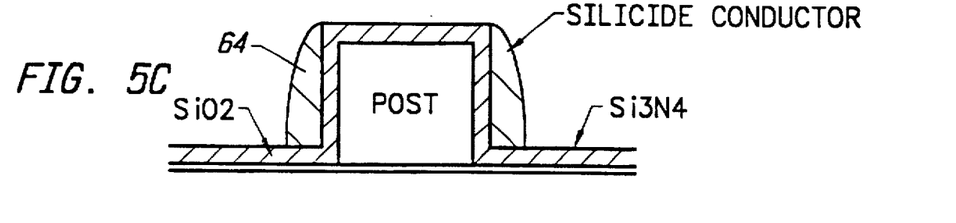
Figure 5D:
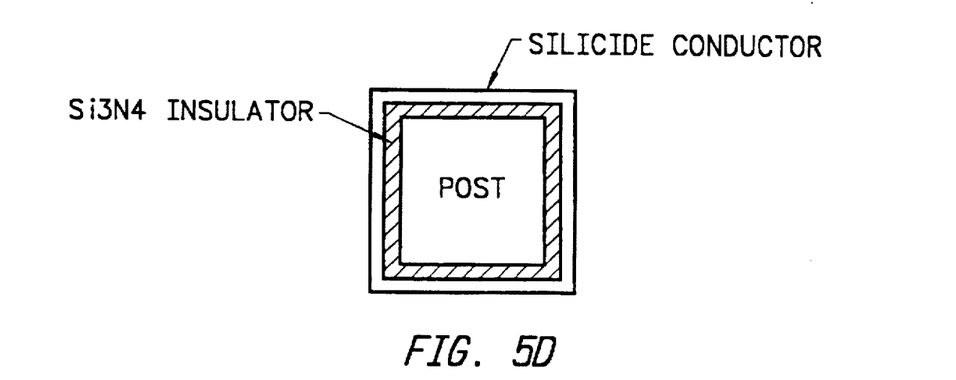

As shown in FIG. 5c, the spacers can then be coated with a desired metal, for example tungsten, capable of reacting with the polycrystalline silicon to form a silicide. The result is a magnetic post separated from an annular conducting region by the layer of silicon nitride. FIG. 5d is a top view of the structure shown in FIG. 5c. FIG. 5d illustrates the post and surrounding annular silicided conductor.

Figure 6A:
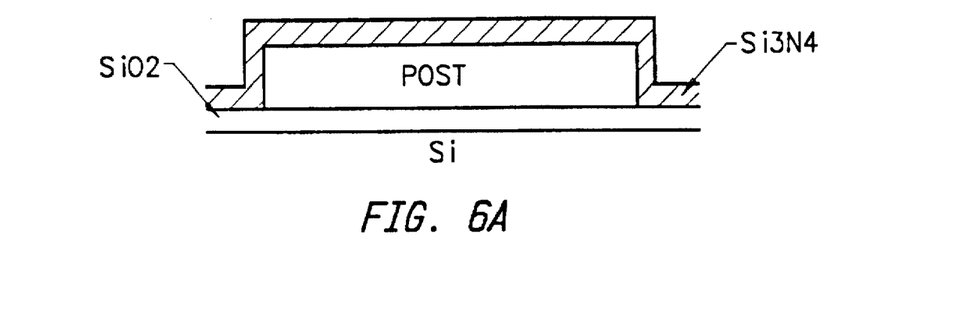
Figure 6B:
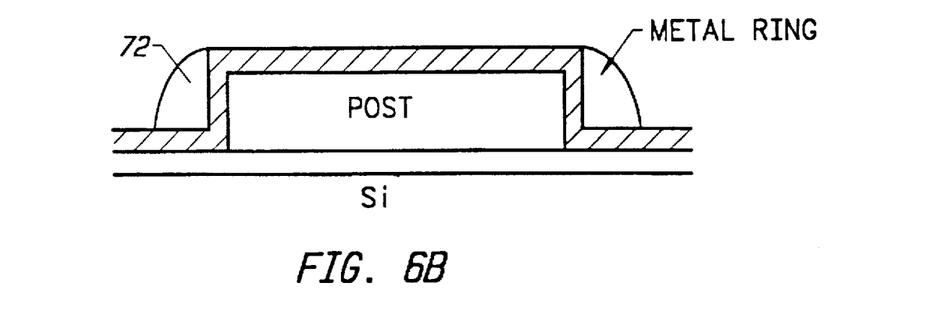
Figure 6C:
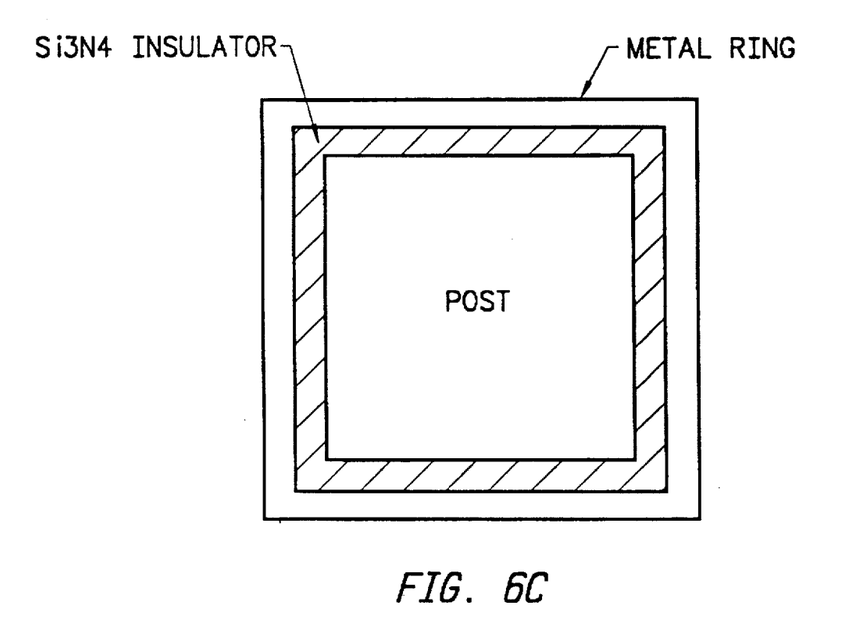

FIGS. 6a through 6c illustrate an alternate technique for fabricating a magnetic post and surrounding conducting loop. As shown in FIG. 6a, the magnetic post and overlying silicon nitride layers are formed using the same techniques described in FIG. 5a. Next, a thick layer of aluminum or other conductor 72 is deposited across the entire surface of the structure and then etched, again using spacer technology, to define the annular aluminum region 72. FIG. 6c is a top view of the structure shown in FIG. 6b.

In both FIGS. 5 and 6, the width of the metal ring including the insulating layer between the metal and the magnetic post is a major factor in determining a final cell size, and therefore the ultimate density of a memory using the cell. For that reason, it is preferable to use conformal metal deposition techniques, such as low pressure CVD, to minimize the width of the ring.

Figure 7:
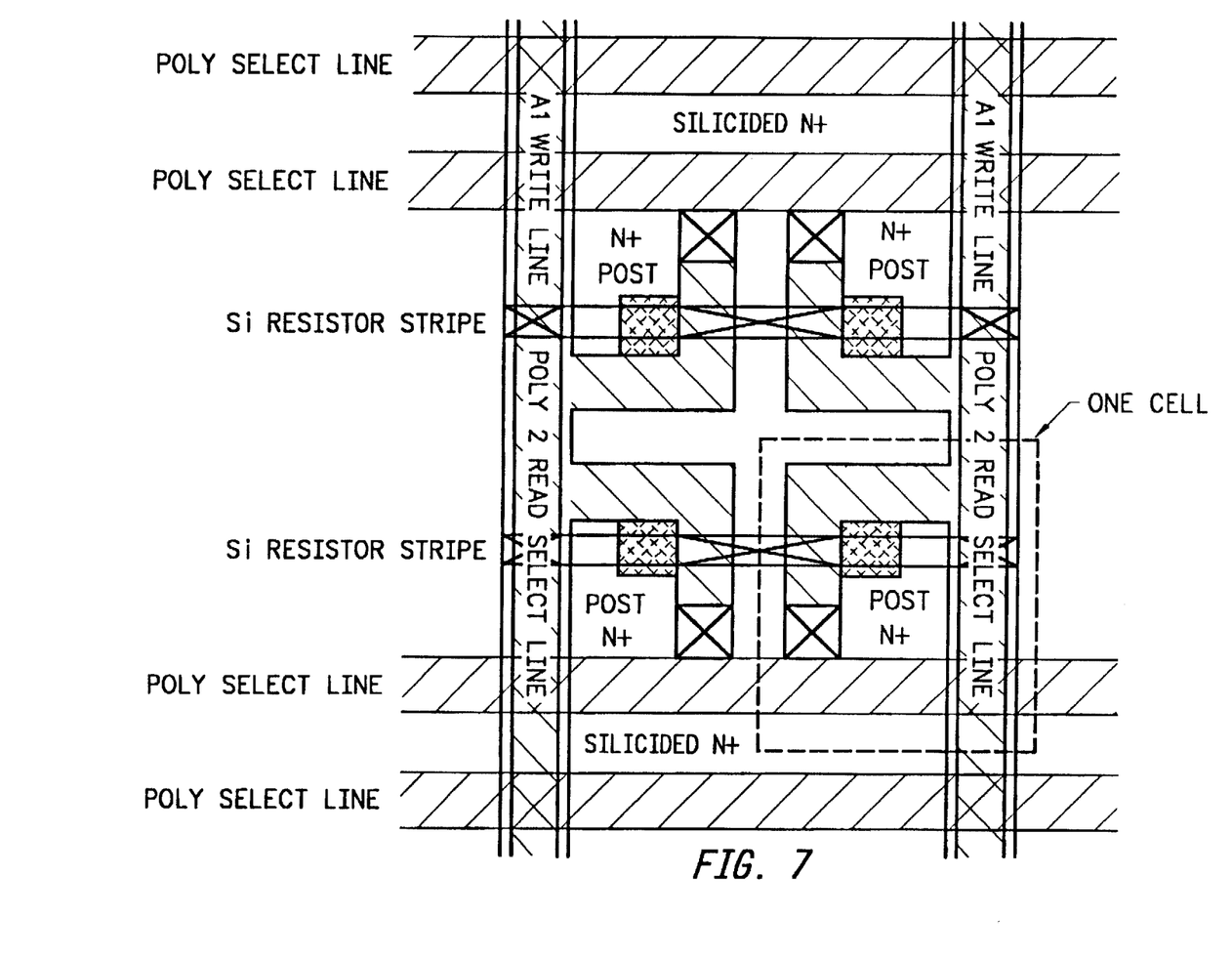
FIGS. 7 and 8 illustrate two different layouts of a memory cell.

FIG. 7 is a diagram which illustrates one possible layout for memory cells manufactured using this invention. FIG. 7 is a top view illustrating how four memory cells are laid out in proximity to each other. As shown in FIG. 7, the four cells are formed in a left-right/up-down symmetrical manner. For the illustrated embodiment, aluminum lines extending vertically through the illustration provide the write lines for row selection during writing, while polycrystalline silicon select lines extending horizontally across the illustration provide the column selection signals.

Silicided heavily doped N type regions designated as such in the illustration provide the read/write column lines, while another silicided polycrystalline silicon layer provides the read lines and the lines for row selection during reading.

To write into a cell, current is supplied in the aluminum write line around the magnetic post to the silicided N type line. This will magnetize the post with the polarity of the magnetism depending upon the direction of the current.

The polycrystalline silicon line for that cell then turns on the MOS transistor of that cell. This enables current to flow in the described loop. Effectively, the polycrystalline silicon line acts as a column select line, with the aluminum line acting as a row select line.

To read the cell current flows from the silicided polycrystalline silicon line through the stripe whose resistivity is modulated during writing, as well as through the MOS transistor to the silicided N type line. The resistance of this line is monitored outside the memory array and indicates the state of the memory cell. As before, one line is the column select line and the other line is the row select line.

With conventional photolithographic technology employing 1 micron design rules, the cell size will be approximately 4 microns by 4 microns. For conventional die, for example 1.5 cm square, with 80% of the die utilized for the array, about 14 megabits of RAM can be provided, while with a 2 cm-by-2 cm die, about 25 megabits can be provided.

Figure 8:
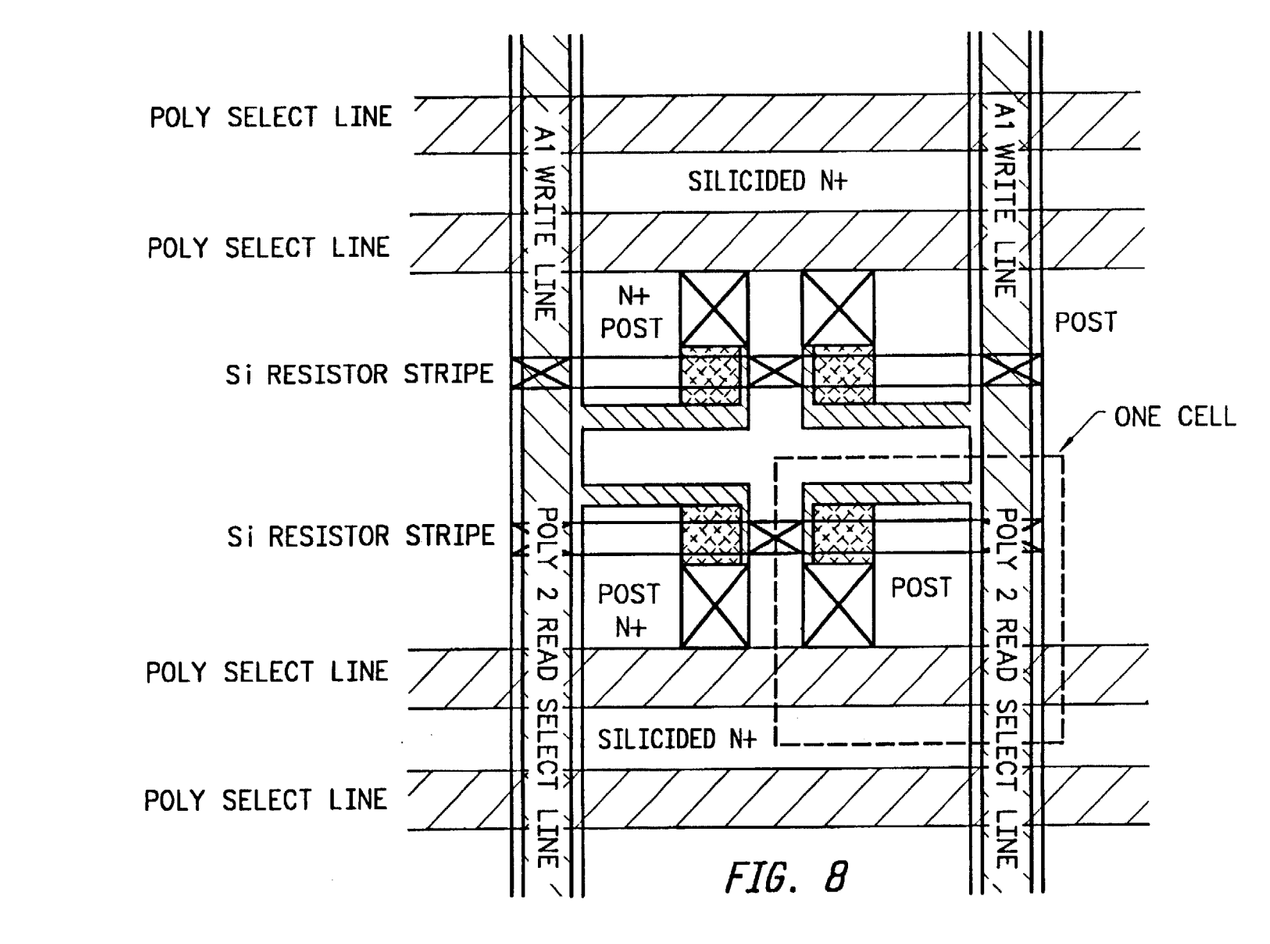

FIG. 8 is a top view of another layout arrangement for four memory cells employing the present invention. The layout shown in FIG. 8 corresponds with that shown in FIG. 7. By using a process such as illustrated in FIG. 5, a more compact cell layout is achieved.

Figure 9:
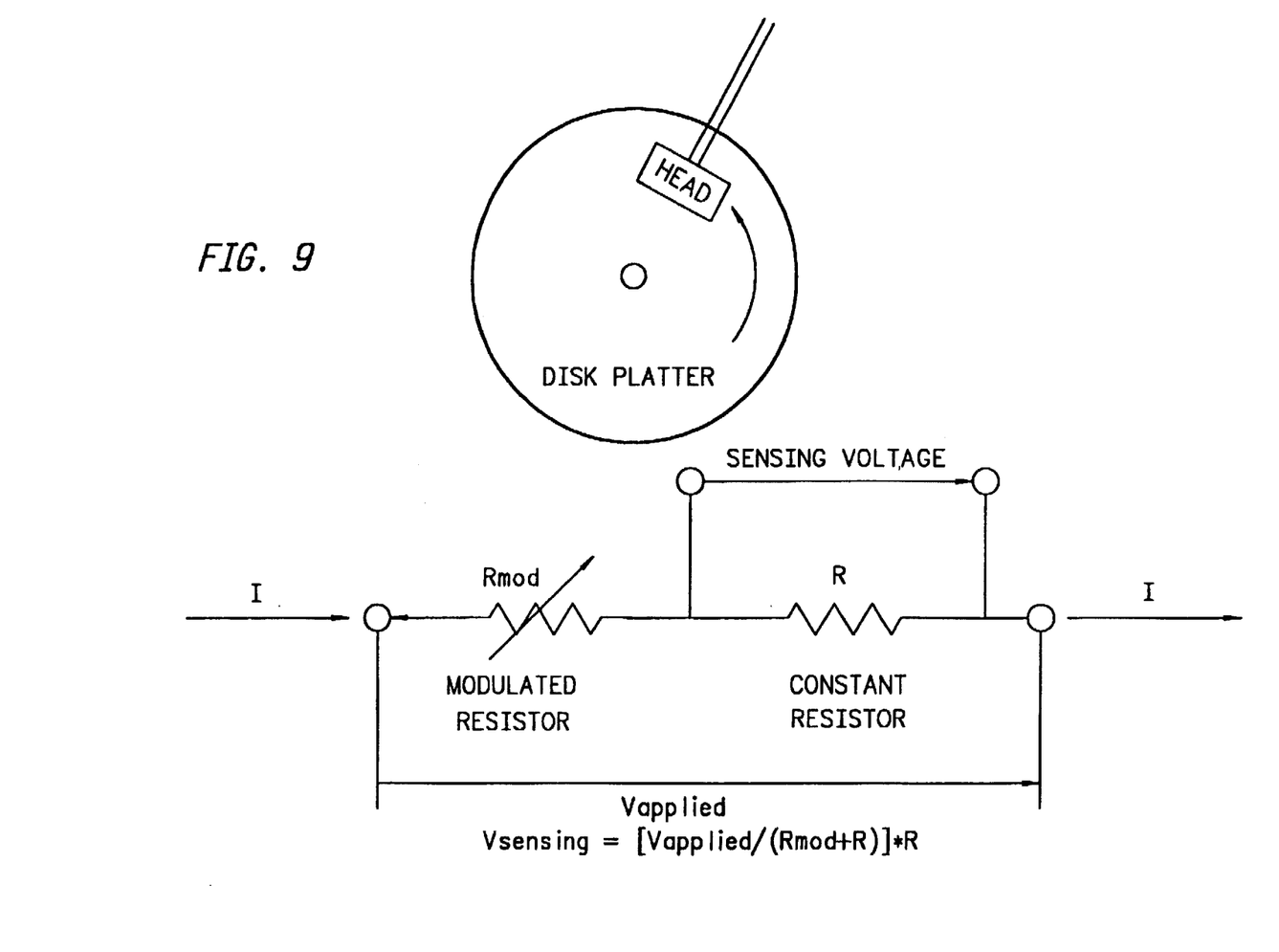
FIG. 9 illustrates a use of the invention in magnetic disk drive heads.

FIG. 9 is a diagram illustrating the application of this invention to a head for a hard disk drive. The practical storage density of hard disk drives depends largely on the ability to read the contents stored thereon reliably without noise. The useful storage density can be increased substantially if the generated sensing voltage can be increased significantly. The large achievable variation of resistance using the technique of this invention allows sensing voltages on the order of volts, rather than millivolts. This enables a substantial increase in readable bit density, enabling higher performance hard disk drives than heretofore available.

FIG. 9 is a diagram illustrating one implementation of the hard disk drive head (commonly known as a thin film head). By implementing the head in-a manner like that depicted in FIG. 2, the magnetic field H of the hard disk pushes the carriers either out of layer 10 into layer 20, or in the opposite direction. The result is that resistivity of layers 10 and 20 will differ by orders of magnitude, leading to a variation of the electric current which is sensed, as shown in FIG. 9. This sensing can be achieved using a voltage applied across a constant value resistor R.

Figure 10:
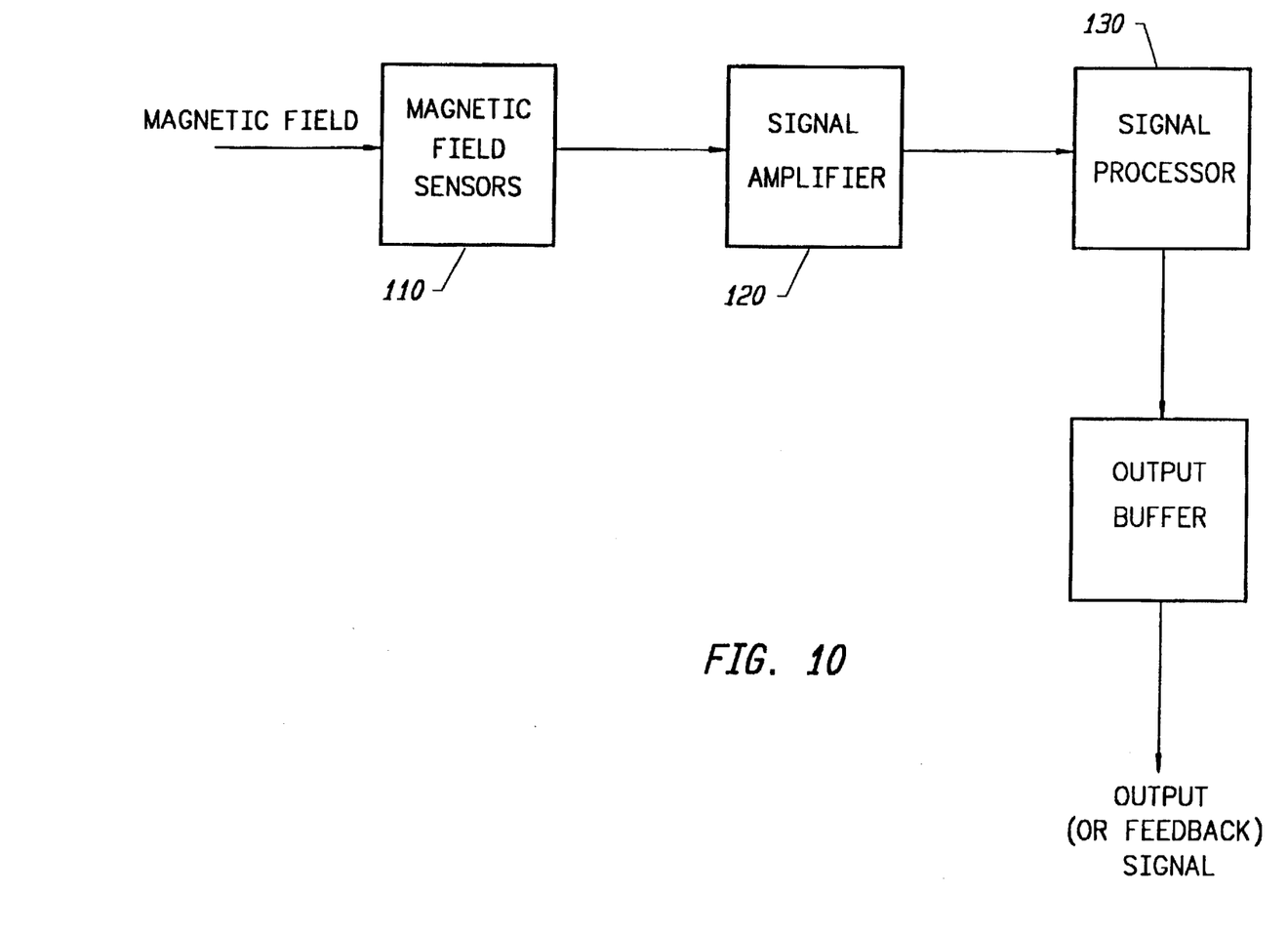
FIG. 10 illustrates a use of the invention in integrated measurement systems.

Although in the foregoing description specific applications of the invention to memory cell technology and hard disk drive heads have been described, it should be appreciated that the invention can be useful wherever magnetic fields are sensed or measured. Other examples of such applications include circumstances in which the analysis of data is performed on the same chip as the measurement. An illustration of this circumstance is shown in FIG. 10 in which an output signal is generated in response to a magnetic field. As shown in FIG. 10, the magnetic field is sensed by a magnetic field sensor 110, then amplified by amplifier 120. Signal processor 130 then provides an appropriate output signal for an output buffer used to drive other apparatus, not depicted.

EXAMPLES

1. Magnitude of the Resistance Modulation

In FIG. 1, the electrical resistance between points A and B is unaffected by the presence of the magnetic field. Assuming a uniform carrier mobility throughout the sample, the resistance depends only on the total number of carriers, not on their local distribution. For more details, see Yang, "Microelectronic Devices", McGraw Hill, 1988.

$$R = 1/G = (1/[\mu w q/l]Q_{total})$$

where  $R$  resistance
  $G$  conductance
  $w, l$  physical sample dimensions
  $q \cdot Q_{total}$  total mobile charge per area
  $q$  charge of electron If the slab of material of FIG. 1 is replaced by two parallel slabs of different mobilities (FIG. 2), the magnetic field pushes the electrons from medium 10 into medium 20 changing the resistance. This resistance ratio k of the resistance between points A and B with and without magnetic field is:

The conductance of the two-media stripe of FIG. 2 becomes:

$$G = (\mu_1 w_1 q/l)Q_1 + (\mu_2 w_2 q/l)Q_2$$
where $q \cdot Q_{1,2}$ total mobile carrier charge per area in slabs of 1 or 2

$\mu$  mobility
  $w, l$  dimensions (see FIG. 2)
  $q$  electron charge

The ratio of the resistances with ($R_B$) and without (R) applied magnetic field B becomes $$k = R_B/R = G/G_B = [\mu_1 Q_1 + \mu_2 Q_2]/[\mu_1 Q_{1,B} + \mu_2 Q_{2,B}]$$
assuming  $\mu_1 \gg \mu_2$
this becomes
$$k = [\mu_1 Q_1]/[\mu_1 Q_{1,B} + \mu_2 Q_{2,B}]$$

If the magnetic field pushes all mobile carriers from side 1 into side 2, $Q_{1,B}$ becomes zero, and the expression for k is simplified to $$k = [\mu_1 Q_1]/[\mu_2 Q_{2,B}]$$
$$k \sim \mu_1/\mu_2$$

where $\mu$ is the mobility in medium 1 and 2, respectively

Thus, the resistance can be modulated according to the ratio of the mobilities. In fact, if medium 20 (e.g., polycrystalline silicon) traps most of the new charges in grain boundaries and immobilizes them, the ratio of the resistances will increase significantly to $$k \sim (\mu_1 Q_1)/(\mu_2 m Q_1)$$

$$k \sim (\mu_1)/(\mu_2 m)$$

where m is the percentage of the charge which is transported from side 1 into side 2 and which remains mobile. m will be quite small. FIG. 2 illustrates this behavior of the charges within the conductor.

2. Doping and Dimensions of Silicon Embodiment

The following illustrates the dimensions and doping of the silicon.

Figure 11A:
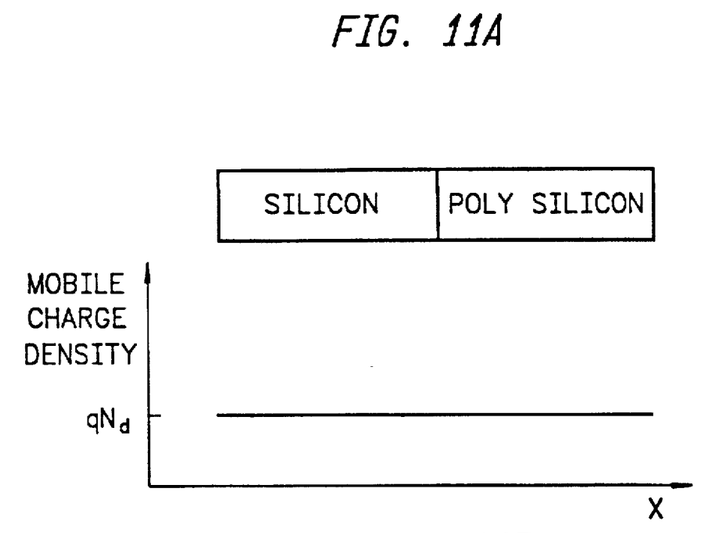
FIGS. 11a–11b show the distribution of electric charge under the influence of the magnetic field.
Figure 11B:
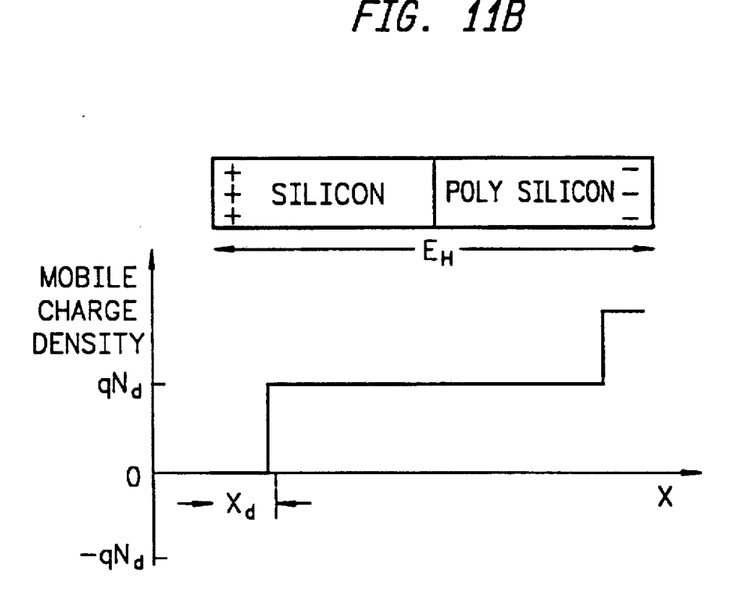

The built-in Hall field according to Yang, "Microelectronic Devices", McGraw Hill, 1988

$$E_H = (\mu V B)/l$$

where  $V$  applied voltage
  $l$  length of the structure according to FIG. 1 and FIG. 2
  $B$  magnetic field This voltage rearranges the electric carriers in the conductor according to FIG. 11. Essentially, the system can be viewed as a parallel plate capacitor.

The sheet charge of the depleted plate is $$Q_S = \epsilon_0 \epsilon_{si} E_H = \epsilon_0 \epsilon_{si} B \mu V/l$$

This sheet charge corresponds to the product of doping density and width of the depleted layer $X_d$.

$$Q_S = N_d X_d q$$

From there one finds $$N_d X_d/B = (\epsilon_0 \epsilon_{si} \mu V)/(ql)$$

With representative values ($\mu$=1000 Vsec/cm$^2$, V=1V, l=1 $\mu$m, $\epsilon_{si}$=11.7, $\epsilon_0$=8.6×10$^{-14}$ Asec/Vcm), this becomes $$N_d \times X_d/B = 6.3 \times 10^{13} \text{ [l/Vsec]}$$

For B=10$^{-4}$ Vsec/cm$^2$ and $X_d$=1000 A, the maximum doping concentration for complete depletion would be $$N_{d max} = 6.3 \times 10^{14} \text{ cm}^{-3}$$

3. The following illustrates suggested values for properties of the magnetic films.

Writing
The magnetic field is:

$$H = I/h \text{ for a height } h \text{ of the aluminum line in FIG. 3}$$

If a maximum current of 10 $\mu$A and a height h=1 $\mu$m are assumed, then H=0.1 A/cm For the current to be able to change the polarity of the magnetization of the thin film post, the coercive force $H_c$ must be smaller than this value, or $$H_c < 0.1 \text{ A/cm}$$

This is in the realm of soft magnetic properties used for magnetic heads for disk drives.

Reading
From the above with the saturation magnetization $M_s$ and with the identity B=$\mu_0$($M_s$+H)$\approx \mu_0 \times M_s$) where $\mu_0$ is the mobility of free space, then for the saturation magnetization:

$$N_d \times X_d/\mu_0 \times M_s = 6.3 \times 10^{13} [1/Vsec]$$
and
$$M_s = 1.26 \times 10^{-6} \times N_d \times X_d \text{ A/cm}$$
For
$N_d = 10^{15}$ cm$^{-3}$ and $X_d = 1000$ A, this yields
$M_s = 12600$ A/cm = 1260 KA/m This is within the achievable realm of hard magnetic thin films for hard disks.

What is claimed is:

1. Apparatus including a structure comprising:

a first region of material having a selected hole or electron mobility, said first region of material being selected from amorphous silicon or polycrystalline silicon;

a second region of material having a different hole or electron mobility than the first region of material, the second region of material being disposed adjacent the first region along a boundary region and in direct contact with the second region of material;

a source, said source applying a magnetic field to both the first and second regions of material in a direction perpendicular to the boundary region to thereby create a Hall voltage across the boundary region and modify the resistance of the first and second regions of material; and a detector, said detector detecting the change in resistance caused by the magnetic field.

2. Apparatus as in claim 1 wherein:

the second region of material comprises single crystal silicon.

3. A semiconductor memory cell comprising:

a substrate, said substrate comprising silicon;

a first region of semiconductor material disposed in the substrate, the first region comprising silicon having a selected hole or electron mobility;

a second region of semiconductor material disposed in the substrate and having a different hole or electron mobility than the first region of semiconductor material, the second region of semiconductor material being disposed adjacent the first region along a boundary region and in direct contact with the second region of semiconductor material;

a region of magnetic material disposed on the substrate and disposed at least partially over the boundary region, the region of magnetic material having a perimeter;

a region of electrically conductive material surrounding the region of magnetic material to form a current path; and wherein the region of electrically conductive material is electrically isolated from the substrate and the region of magnetic material.

4. A semiconductor memory cell as in claim 3 wherein:

the substrate and the first region have opposite impurity types;

the second region of semiconductor material is selected from polycrystalline silicon or amorphous silicon; and;

the region of electrically conductive material comprises aluminum.

5. A semiconductor memory cell as in claim 3 wherein the region of magnetic material comprises at least one of cobalt and chromium or their alloys.

6. A semiconductor memory cell as in claim 3 wherein the region of magnetic material comprises at least one of an oxide of cobalt and an oxide of chromium.

7. A method of operating a memory cell which includes a substrate;

a first region of semiconductor material comprising silicon having a selected hole or electron mobility disposed in the substrate, a second region of semiconductor material comprising silicon having a different hole or electron mobility than the first region of semiconductor material disposed in the substrate adjacent the first region, a region of magnetic material disposed on the substrate at least partially over the boundary region, a region of electrically conductive material disposed around the region of magnetic material to form a current path, the method comprising:

introducing a current into the conductor to establish a magnetic field in the magnetic material in one of two directions to thereby effect the resistance of the first and second regions of semiconductor material.

8. Apparatus of claim 1 wherein said first region of material is made using chemical vapor deposition.

9. Apparatus of claim 1 wherein said structure is provided in a head for a disk drive.

10. Apparatus of claim 9 wherein said head is a thin film head.

11. Apparatus of claim 1 wherein said first region of material is P-type conductivity.

12. Apparatus of claim 1 wherein said second region of material is P-type conductivity.

13. Apparatus of claim 1 wherein said source is a magnetic post.

14. Apparatus of claim 1 wherein said structure is provided in a memory cell.

15. Apparatus of claim 1 wherein said structure is provided in a random access memory cell.

16. Apparatus of claim 1 wherein said structure is made using a design rule of 1 micron and less.

17. The method of claim 7 wherein said first region of material is made using chemical vapor deposition.

18. The method of claim 7 wherein said first region of semiconductor material comprises amorphous silicon.

19. The method of claim 7 wherein said first region of semiconductor material comprises polycrystalline silicon.

20. The method of claim 7 wherein the second material region comprises polycrystalline silicon.

21. The method of claim 7 wherein the second material region comprises amorphous silicon.

22. The method of claim 7 wherein said first region of material is P-type conductivity.

23. The method of claim 7 wherein said second region of material is P-type conductivity.

24. The method of claim 7 wherein said memory cell is made using a design rule of 1 micron and less.

* * * * *